(12) United States Patent
Hatajima

(10) Patent No.: US 7,132,671 B2
(45) Date of Patent: Nov. 7, 2006

(54) SUBSTRATE TESTING DEVICE AND SUBSTRATE TESTING METHOD

(75) Inventor: Hiroki Hatajima, Hadano (JP)

(73) Assignee: Shimadzu Corporation, Kyoto (JP)

( * ) Notice: Subject to any disclaimer, the term of this patent is extended or adjusted under 35 U.S.C. 154(b) by 42 days.

(21) Appl. No.: 10/828,360

(22) Filed: Apr. 20, 2004

(65) Prior Publication Data

US 2004/0222385 A1 Nov. 11, 2004

(30) Foreign Application Priority Data

Apr. 22, 2003 (JP) ............................ 2003-116634

(51) Int. Cl.
*H01J 37/28* (2006.01)

(52) U.S. Cl. ................... 250/491.1; 250/310
(58) Field of Classification Search ................ 250/310, 250/311, 491.1, 398; 324/158 R
See application file for complete search history.

(56) References Cited

U.S. PATENT DOCUMENTS 5,910,847 A * 6/1999 Van der Werf et al. ..... 356/401

FOREIGN PATENT DOCUMENTS

| JP | 2000-009661 | 1/2000 |
|----|----|----|
| KR | 2001-0029226 | 4/2001 |
| KR | 2002-0054170 | 7/2002 |

* cited by examiner

*Primary Examiner*—Kiet T. Nguyen
(74) *Attorney, Agent, or Firm*—Rankin, Hill, Porter & Clark LLP

(57) ABSTRACT

In a substrate testing device, a testing unit acquires a tested result of a substrate by scanning of an electron beam. An alignment mark detecting unit optically detects an alignment mark on the substrate. A substrate position calculating unit calculates a substrate position within the substrate testing device from a position of the alignment mark. A position aligning unit aligns a position of the tested result with the calculated substrate position.

6 Claims, 7 Drawing Sheets

TESTED RESULT (DEFECT RESULT)

SUBSTRATE PIXEL

SUBSTRATE TESTING DEVICE AND SUBSTRATE TESTING METHOD

BACKGROUND OF THE INVENTION

1. Field of the Invention

The present invention relates to a substrate alignment mechanism and a substrate testing device having the substrate alignment mechanism and a substrate testing method, which is applicable to testing a TFT array substrate for use in flat panel displays such as a liquid crystal display or an organic EL display, for example.

2. Description of the Related Art

In the manufacturing process of flat panel displays such as liquid crystal display or organic EL display, a plurality of panels having a pattern of TFT array are usually formed on a glass substrate, and each panel is cut out from the glass substrate. In testing the flat panel displays, the glass substrate is tested, or the TFTs or pixels formed on the glass substrate are evaluated for the characteristics.

To test the TFT array formed on the substrate, the TFT array substrate is usually held on the stage.

In testing the TFT array, a repair operation is performed using the tested result, whereby it is required to determine a defect position accurately. Therefore, it is required that a substrate testing device locates a substrate to be tested at the same position every time. However, a substrate conveying mechanism such as a movable stage does not have an enough precision to meet the requirements. Though the mechanical alignment may be made to adjust the alignment, there is a limitation on the precision in the mechanical adjustment of alignment, whereby it is difficult to meet the necessary precision.

To make the alignment adjustment of the substrate, it is common that an alignment mark is provided on the substrate, and detected to determine the substrate position with respect to the substrate testing device. Since the substrate testing device with SEM tests the substrate employing the electron beam, the alignment mark may be detected by the scanning of the electron beam.

However, when the alignment mark is detected employing the electron beam, it may be difficult to detect the alignment mark accurately, depending on the material of the alignment mark. For example, when the alignment mark is made of an insulating material, there is a problem that the alignment mark is charged up due to irradiation with the electron beam, causing a failure such as discharge. Also, there is another problem that the alignment mark is difficult to distinguish from the substrate, because they are very close in the signal intensity and thereby the image contrast.

SUMMARY OF THE INVENTION

It is an object of the present invention to provide a substrate testing device and method which can allocate a tested result onto a substrate accurately. It is another object of the present invention to provide a substrate testing device and method which can detect a substrate position irrespective of a material of an alignment mark.

In the present invention, a tested result is aligned with coordinates on a substrate by making the data processing to allocate the tested result onto the substrate, without needing a mechanical alignment adjustment that is performed by moving the substrate with respect to the substrate testing device, whereby the precision is improved. Also, the alignment mark is optically detected, whereby a substrate position is detected irrespective of the material of the alignment mark.

The present invention provides a substrate testing device for testing a substrate by scanning of an electron beam across the substrate, comprising a testing unit for acquiring a tested result of the substrate by the scanning of the electron beam, an alignment mark detecting unit for optically detecting an alignment mark on the substrate, a substrate position calculating unit for calculating a substrate position within the substrate testing device from a position of the alignment mark, and a position aligning unit for aligning a position of the tested result with the calculated substrate position.

The testing unit detects a detection signal and acquires the test result by the scanning of electron beam across the substrate. Since the coordinate position of the test result is referenced to the substrate testing device, when the substrate is displaced with respect to the substrate testing device, the position of the tested result is not matched with the position on the substrate.

The alignment mark detecting unit optically detects the alignment mark provided on the substrate, and the substrate position calculating unit calculates the substrate position within the substrate testing device from the position of the detected alignment mark. In calculating the substrate position, a misregistration between the detected alignment mark position and the reference alignment mark position is obtained, and the shift amounts in the x and y directions and the inclination are calculated from the misregistration.

The position aligning unit aligns the position of tested result with the calculated substrate position. Since the calculated substrate position is converted into the coordinate position with reference to the substrate testing device, the position of tested result is aligned with reference to the substrate testing device. Even when the position of tested result is not matched with the position on the substrate, the tested result is allocated onto the substrate by the position alignment.

The tested result for position alignment may be directly the image data acquired by the testing unit, and also mat be the defect result obtained by making the defect test using the image data.

The alignment mark detecting unit used for the substrate testing device of the present invention comprises an optical microscope or a CCD camera for picking up an image of the alignment mark on the substrate. The alignment mark provided on the substrate placed in the substrate testing device is fixed at a predetermined position within an image pickup range.

Since the alignment mark detecting unit of the present invention detects the alignment mark on the substrate by an optical unit, it is possible to reduce the difficulties of distinguishing between the substrate and the alignment mark, which may be caused depending on the material of the alignment mark, including a charge-up problem due to irradiation with the electron beam, and a lower contrast caused by detecting the electron beam.

DETAILED DESCRIPTION OF THE INVENTION

The preferred embodiments of the present invention will be described below with reference to the accompanying drawings.

Figure 1:
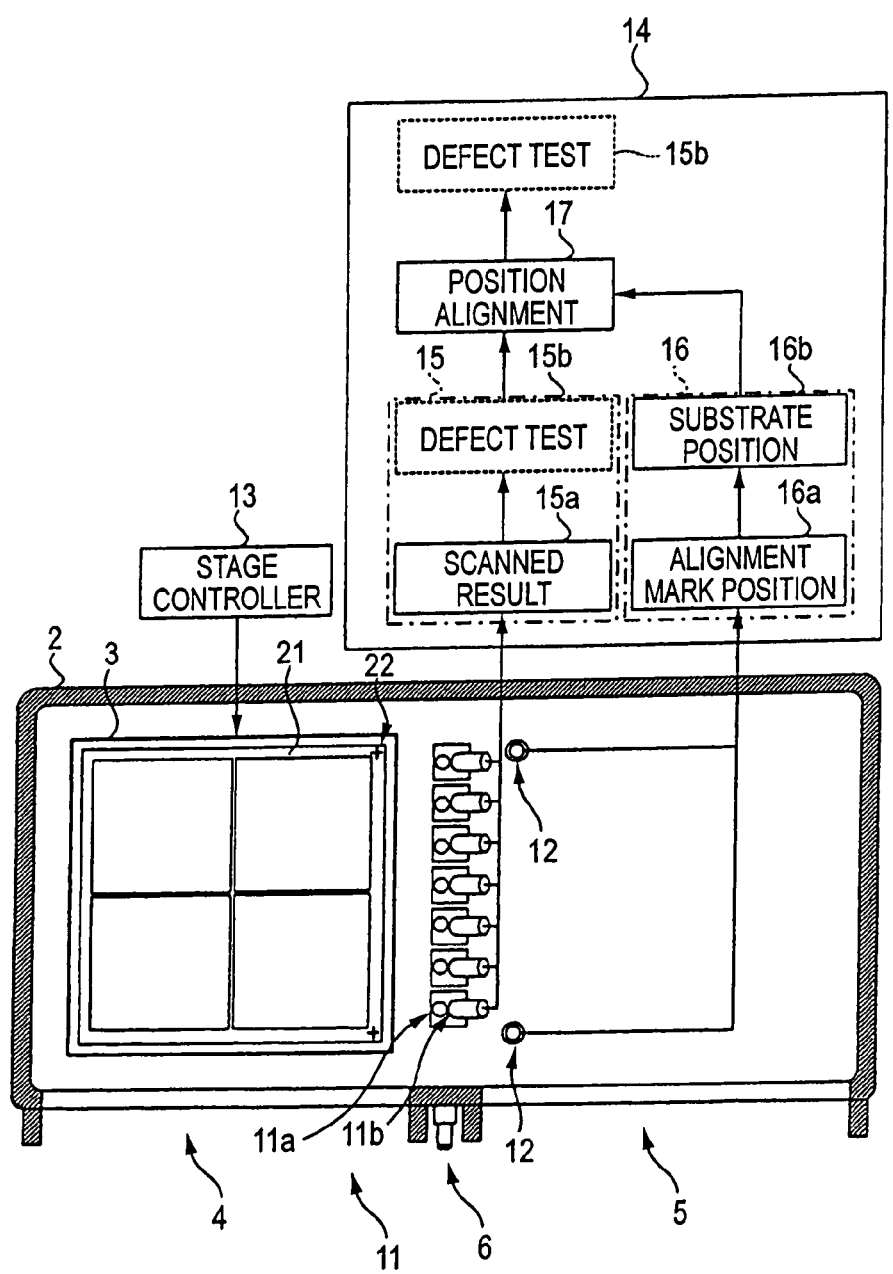
FIG. 1 is a schematic view for explaining the diagrammatic configuration of a substrate testing device according to the present invention.

FIG. 1 is a schematic view for explaining the diagrammatic configuration of a substrate testing device according to the present invention. In FIG. 1, the substrate testing device 1 comprises a testing unit 11 for testing a TFT substrate 21 by the scanning of an electron beam, an alignment mark detecting unit 12 for optically detecting an alignment mark 22 provided on the TFT substrate 21, and a processing unit 14 for performing the processings such as testing, substrate position calculation and position alignment.

The substrate testing device 1 has a testing chamber 2, within which the testing unit 11, the alignment mark detecting unit 12 and a stage 3 are provided. The testing chamber 2 has the substrate inlet or outlet openings 4 and 5 for carrying the TFT substrate 21 into or out of the chamber, and a gas exhaust or suction mechanism 6 for exhausting or sucking the gas out of or into the testing chamber 2.

The stage 3 supports the TFT substrate 21 within the testing chamber 2, and carries the TFT substrate 21 to make the scanning of an electron beam. The movement of the stage 3 is effected by stage controller 13.

The testing unit 11 comprises a substrate testing electron gun 11a for applying an electron beam onto the TFT substrate 21 and a detector 11b for detecting a signal of electron beam emitted from the substrate due to irradiation with electron beam, and is securely attached in the testing chamber 2. In FIG. 1, a plurality of sets of the substrate testing electron gun 11a and the detector 11b are arranged in the direction orthogonal to the moving direction of the stage 3. The scanning of electron beam is made by moving the stage 3 supporting the TFT substrate 21, as well as moving the electron beam emitted from the substrate testing electron gun 11a.

Also, the alignment mark detecting unit 12 optically detects the alignment mark, and has a combination of an optical microscope and a CCD camera, for example. The alignment mark detecting unit 12 detects the alignment mark 22 on the TFT substrate 21 that is stationary at a pickup position within an image pickup range, when the TFT substrate 21 laid on the stage 3 is located at a predetermined position. Since a locational error falls of the stage 3 within the pickup range of the alignment mark detecting unit 12, the alignment mark 22 of the TFT substrate 21 is reflected on an image pickup screen for the alignment mark detecting unit 12, when the stage 3 is stopped at predetermined position under the control of the stage controller 13.

The processing unit 14 comprises a test processing unit 15 for making the signal processing of a substrate signal by inputting a detection signal detected by the testing unit 11, a substrate position calculating unit 16 for calculating the substrate position by inputting an image of alignment mark detected by the alignment mark detecting unit 12, and a position aligning unit 17 for aligning the substrate position with the position of tested result from the test processing unit 15 to allocate the tested result to the substrate position.

The test processing unit 15 receives a detection signal of the detector 11b in the testing unit 11 and acquires a tested result 15a through the image processing. The tested result 15a is employed to make the defect determination for the TFT substrate, and acquire the defect result 15b. The defect determination may be made before or after the position alignment.

The substrate position calculating unit 16 inputs an image picked up by the alignment mark detecting unit 12, calculates the alignment mark position 16a on the image pickup screen, and further calculates the substrate position 16b in the substrate testing device 1 from the alignment mark position 16a. The calculated substrate position 16b compensates a predetermined position of the TFT substrate 21 laid on the stage 3 for the x, y directions and the inclination. The position aligning unit 17 aligns the position of tested result with the substrate position, employing the substrate position 16b.

The processing of the position aligning unit 17 is data processing for aligning data of the tested result 15a with the substrate position of the TFT substrate 21, and includes no mechanical movement of the TFT substrate 21. Therefore, the aligning precision problem caused by a mechanical movement mechanism is excluded, whereby the positioning precision mainly depends on the precision of the alignment mark detecting unit 12 and may be high precision.

Figure 2A:
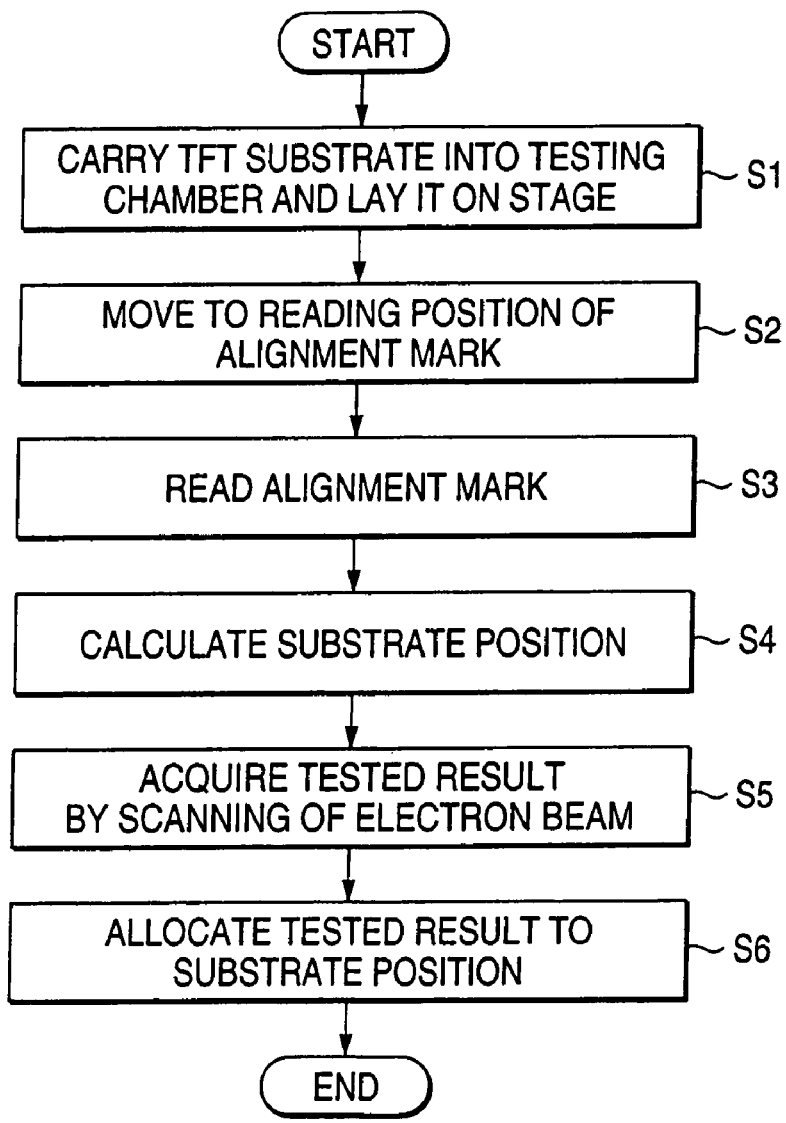
FIGS. 2A and 2B are flowcharts for explaining an operation example of the substrate testing device according to the present invention.
Figure 2B:
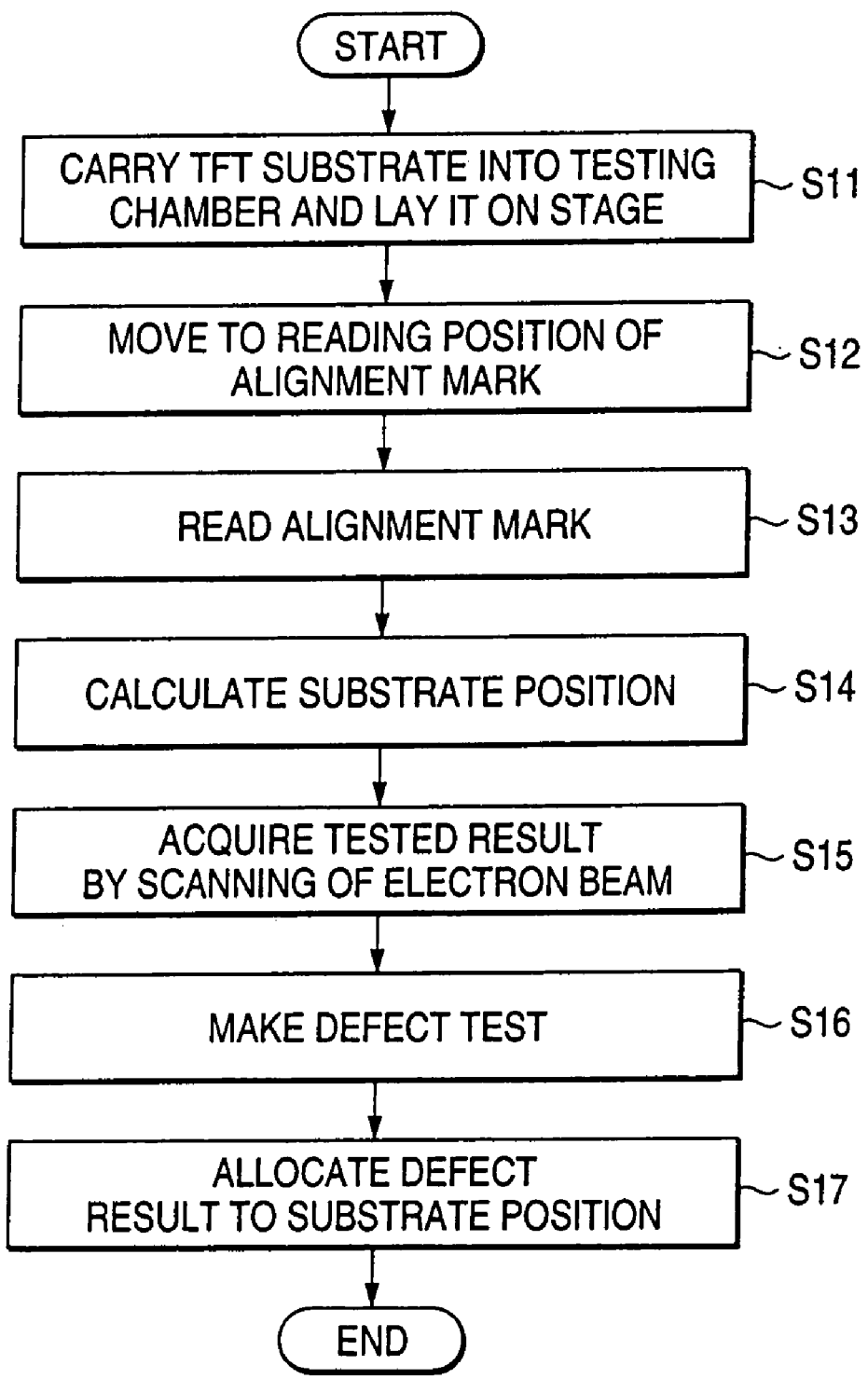
Figure 3A:
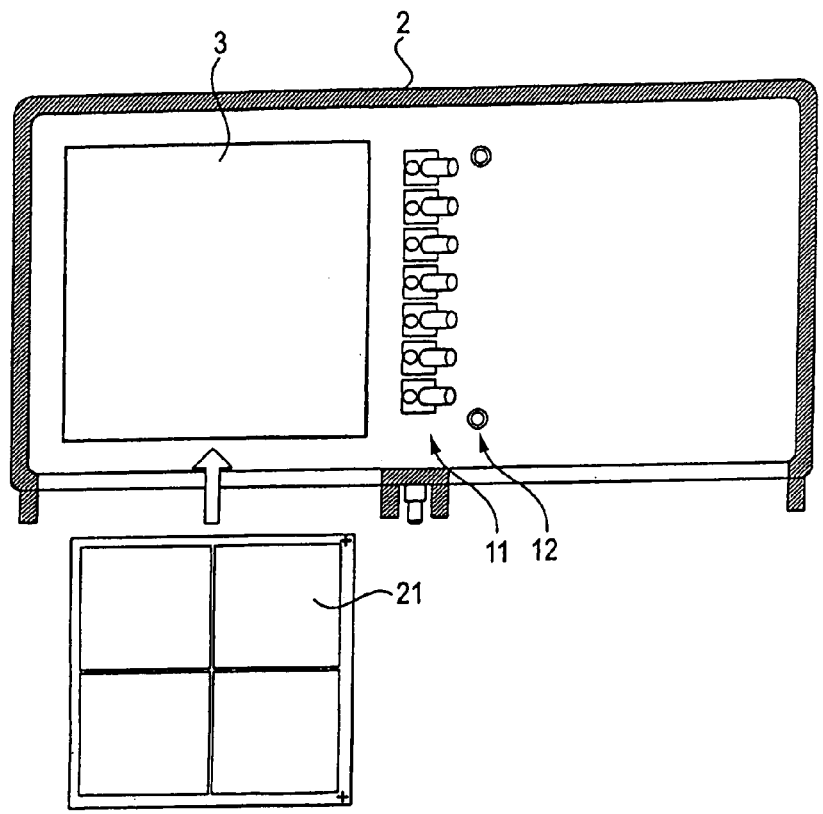
FIGS. 3A and 3B are schematic operation views for explaining a moving state of substrate and the scanning.
Figure 3B:
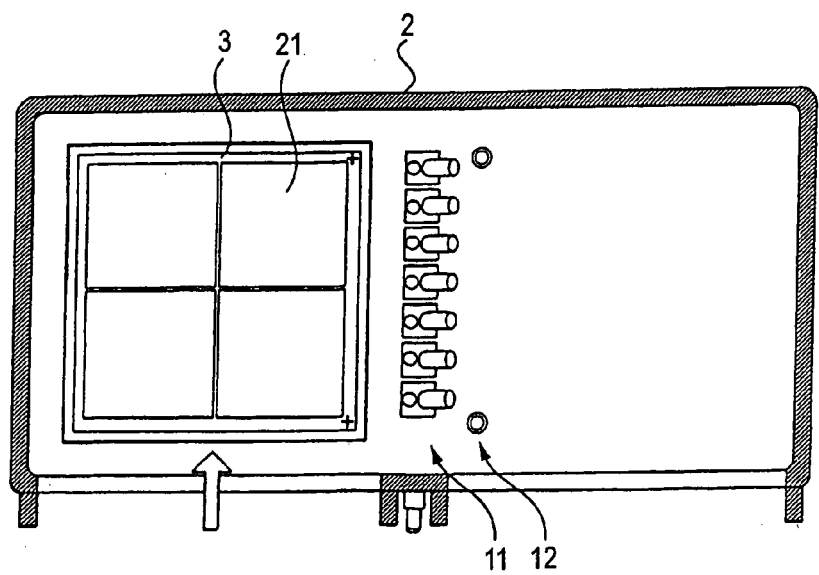
Figure 4A:
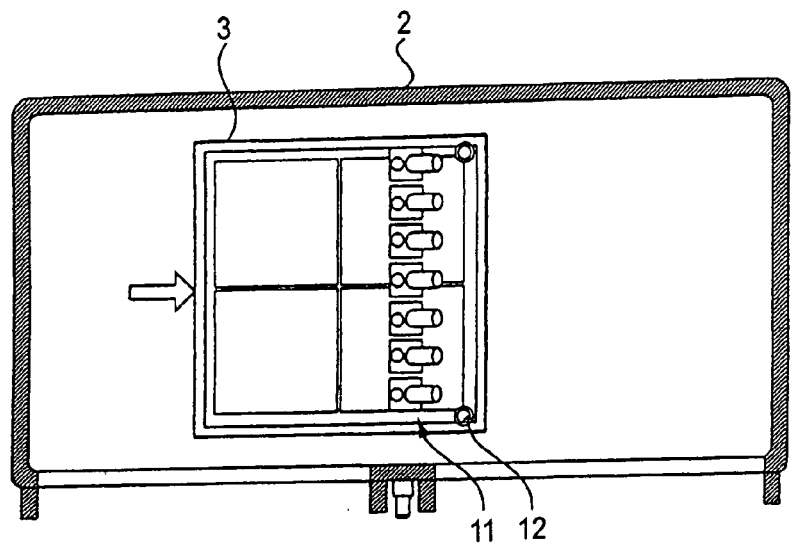
FIGS. 4A–4C are schematic operation views for explaining a moving state of substrate and the scanning.
Figure 4B:
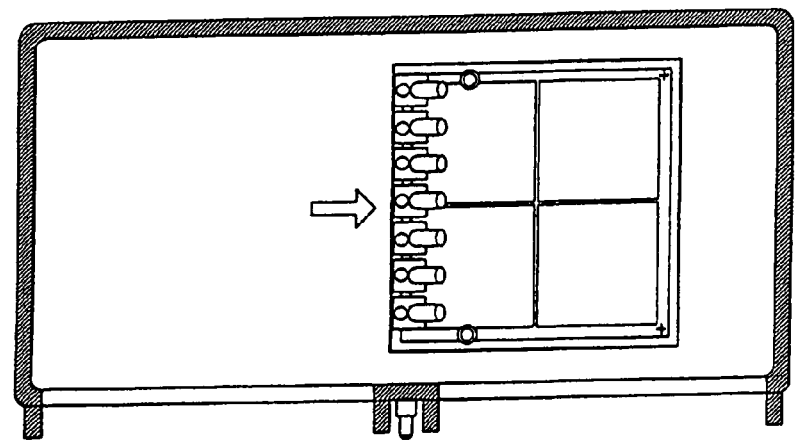
Figure 4C:
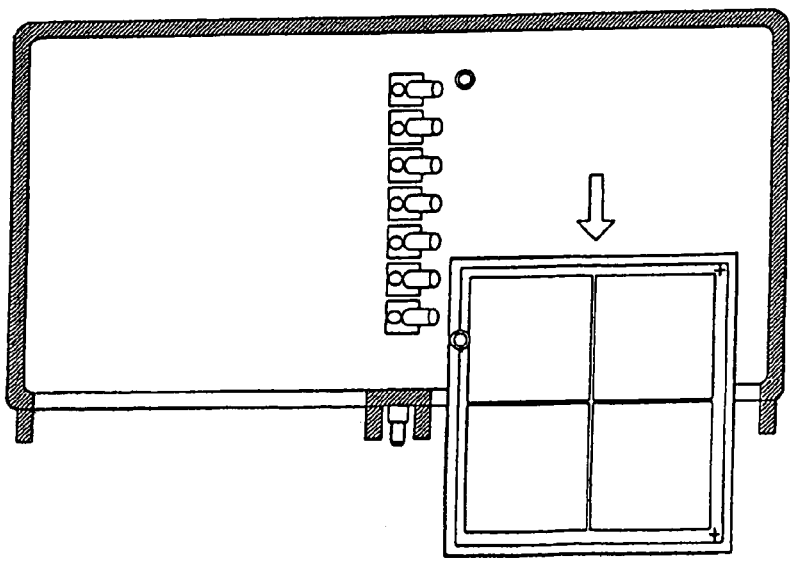
Figure 5A:
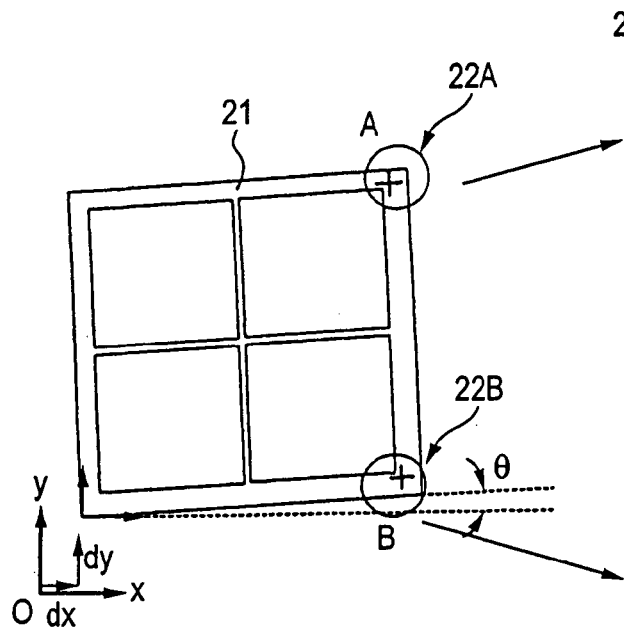
FIGS. 5A–5D are schematic views for explaining a way of calculating the substrate position from the alignment mark position.
Figure 5B:
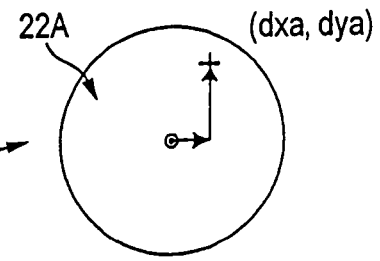
Figure 5C:
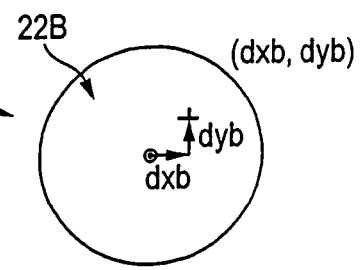
Figure 5D:
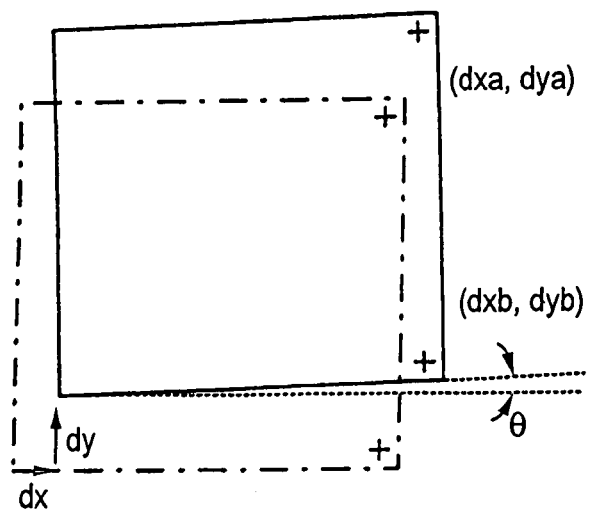
Figure 6A:
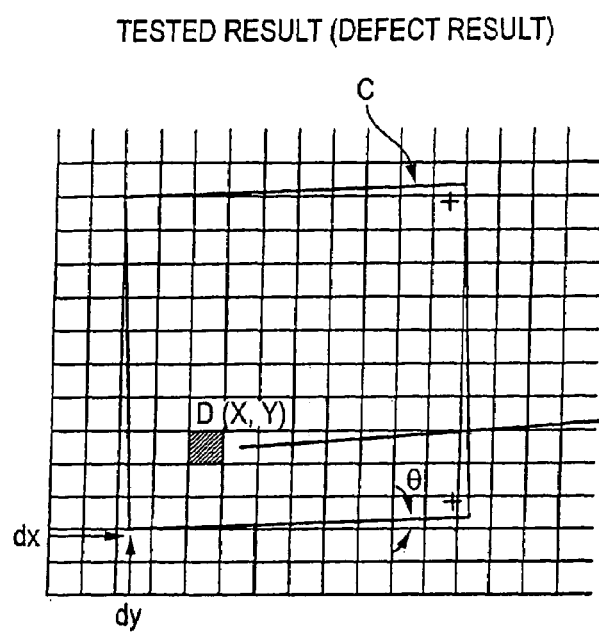
FIGS. 6A and 6B are schematic views for explaining a way of allocating the tested result to the substrate position.
Figure 6B:
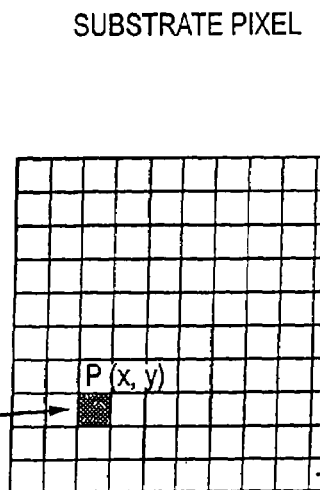

An operation example of the substrate testing device according to the present invention will be described below. FIGS. 2A–2B are flowcharts for explaining an operation example of the substrate testing device according to the present invention. FIGS. 3A–3B and 4A–4C are schematic operation views for explaining the moving states of substrate and the scanning. FIGS. 5A–5D are schematic views for explaining a way of calculating the substrate position from the alignment mark position. FIGS. 6A–6B are schematic views for explaining a way of allocating the tested result to the substrate position. In the following, the (step S) corresponds to the flowchart as shown in FIGS. 2A–2B.

The TFT substrate 21 is carried into the testing chamber 2 (FIG. 3A), and laid on the stage 3 (FIG. 3B) (step S1). The stage controller 13 controls a drive mechanism, not shown, to move the stage 3, and stop and locate the TFT substrate 21 at a predetermined position in the testing chamber 2 (FIG. 4A). A stop position of the TFT substrate 21 is within a range in which the alignment mark detecting unit 12 can detect the alignment mark 22 provided on the TFT substrate 21.

Accordingly, the TFT substrate 21 is located at the stop position, so that the alignment mark detecting unit 12 detects the alignment mark 22 within the image pickup range. FIG. 4A shows one example of the TFT substrate 21 located at the stop position. Herein, it is supposed that the TFT substrate 21 located at the stop position is shifted by dx in the x direction and by dy in the y direction with respect to the reference position (x, y normal coordinates in the figure), and inclined by θ.

The alignment mark detecting unit 12 detects the alignment marks 22A and 22B provided on the TFT substrate 21. The circles denoted by A and B as shown in FIGS. 5A, 5B and 5C typically represent the image pickup ranges where the alignment mark detecting unit 12 detects the alignment mark. Due to misregistration of the TFT substrate 21 located at the stop position, the picked up alignment mark 22A, 22B is detected off the substrate position (circular mark in FIG. 5B) as shown in FIGS. 5B and 5C.

For example, the alignment mark 22A as shown in FIG. 5B is detected at a position (dxa, dya) off the substrate position, and the alignment mark 22B as shown in FIG. 5C is detected at a position (dxb, dyb) off the substrate position. Each of the alignment mark positions (dxa, dya) and (dxb, dyb) is associated with a shift amount (dx, dy) and an inclination θ of the TFT substrate 21 with respect to the reference position (x, y normal coordinates in the figure) for testing and scanning the substrate (step S3).

The substrate position calculating unit 16 calculates the alignment mark position 16a by making the signal processing for a detection signal from the alignment mark detecting unit 12, and further calculates the position (dx, dy) and inclination θ of the TFT substrate 21 with respect to the reference position (x, y normal coordinates in the figure) for testing and scanning the substrate from the alignment mark positions 16a (dxa, dya) and (dxb, dyb). FIG. 5D shows a correspondence relation between the alignment mark position 16a (dxa, dya), (dxb, dyb) and the position (dx, dy) with inclination θ of the TFT substrate 21 (step S4).

Then, the stage controller 13 drives the stage 3 to move the TFT substrate 21 with respect to the testing unit 11 to make the scanning. The detector 11b detects the alignment mark along with the scanning (FIG. 4B). The test processing unit 15 acquires the tested result 15a from a detection signal of the detector 11b (step S5).

The position aligning unit 17 aligns the position of the tested result 15a with the substrate position 16b. The position aligning process involves converting the position of the tested result 15a into the substrate position, based on the position (dx, dy) with inclination θ of the TFT substrate 21 calculated at step S4 for testing and scanning the substrate.

The tested result 15a is allocated to the pixels on the substrate by the position alignment. FIGS. 6A and 6B simply shows a state where the tested result (as shown in FIG. 6A) is allocated to the pixels on the substrate (as shown in FIG. 6B). For example, a lattice in FIG. 6A indicates a pixel represented in the coordinate system on the substrate testing device, and a rectangle C displayed over the lattices indicates the substrate laid on the stage. The substrate represented by the rectangle C is specified by the position (dx, dy) with inclination θ in the coordinate system on the substrate testing device.

Accordingly, the pixel represented by D(X,Y) in the coordinate system of the substrate testing device is allocated to the pixel represented by P(x,y) on the substrate (FIG. 6B) The test processing unit 15 makes the detect test, based on the tested result 15a and acquires the defect result 15b (step S6). After the end of test, the TFT substrate 21 is carried out of the testing chamber 2 through the substrate inlet or outlet opening 4 or 5.

Also, in allocating the tested result onto the substrate, the defect result 15b may be acquired through the defect test from the tested result 15a at step S16 in the flowchart of FIG. 2B, and the defect result 15b allocated onto the substrate at step S17. The steps S11 to S15 of the flowchart in FIG. 2B may be identical to the steps S1 to S5 of the flowchart in FIG. 2A.

As described above, with the present invention, the tested result is correctly allocated onto the substrate. Also, the position of the substrate is detected, irrespective of the material of the alignment mark.

What is claimed is:

1. A substrate testing device for testing a substrate by scanning of an electron beam across the substrate, comprising:
   a testing unit for acquiring a tested result of the substrate by the scanning of the electron beam;
   an alignment mark detecting unit for optically detecting an alignment mark on the substrate;
   a substrate position calculating unit for calculating a substrate position within said substrate testing device from a position of said alignment mark; and
   a position aligning unit for aligning a position of the tested result with the calculated substrate position, converting the tested result position into the substrate position, and allocating the tested result to the substrate.

2. The substrate testing device according to claim 1, wherein said position aligning unit aligns a defect result, obtained by a defect test based on the tested result, with the substrate position.

3. The substrate testing device according to claim 2, wherein said alignment mark detecting unit comprises an optical microscope or a CCD camera for picking up an image of the alignment mark on the substrate.

4. The substrate testing device according to claim 1, wherein said alignment mark detecting unit comprises an optical microscope or a CCD camera for picking up an image of the alignment mark on the substrate.

5. A substrate testing method for testing a substrate by scanning of an electron beam across the substrate within a substrate testing device, comprising:
   acquiring a tested result of the substrate by the scanning of the electron beam;
   optically detecting an alignment mark on the substrate;
   calculating a substrate position within the substrate testing device from a position of the alignment mark;
   aligning a position of tested result with the calculated substrate position by converting the tested result position into the substrate position based upon the calculated substrate position; and
   allocating the tested result to the substrate.

6. The substrate testing method according to claim 5, wherein said position aligning step includes aligning a defect result, obtained by a defect test based on the tested result, with the substrate position.

* * * * *